United States Patent
Liu et al.

(10) Patent No.: US 9,684,083 B2
(45) Date of Patent: Jun. 20, 2017

(54) X-RAY DETECTOR PANEL

(71) Applicant: General Electric Company, Schenectady, NY (US)

(72) Inventors: James Zhengshe Liu, Salt Lake City, UT (US); Habib Vafi, Brookfield, WI (US); Paul Richard Granfors, Berkeley, CA (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 289 days.

(21) Appl. No.: 14/242,504

(22) Filed: Apr. 1, 2014

(65) Prior Publication Data

US 2015/0276941 A1  Oct. 1, 2015

(51) Int. Cl.
  *G01T 1/24* (2006.01)
  *H01L 31/18* (2006.01)
  *G01T 1/20* (2006.01)

(52) U.S. Cl.
  CPC .............. *G01T 1/24* (2013.01); *G01T 1/2018* (2013.01); *H01L 31/18* (2013.01)

(58) Field of Classification Search
  CPC ....................................................... G01T 1/24
  See application file for complete search history.

(56) References Cited

U.S. PATENT DOCUMENTS

| | | | |
|---|---|---|---|
| 4,645,733 A | 2/1987 | Sullivan | |
| 5,464,984 A * | 11/1995 | Cox | G01T 1/2018 250/366 |
| 5,786,597 A * | 7/1998 | Lingren | G01T 1/161 250/370.01 |
| 6,510,195 B1 * | 1/2003 | Chappo | G01T 1/2018 250/208.1 |
| 6,642,524 B2 * | 11/2003 | Vafi | G01T 1/2018 250/370.09 |
| 2005/0098732 A1 * | 5/2005 | Liu | H01L 25/042 250/370.11 |
| 2008/0099694 A1 * | 5/2008 | Shoji | G01T 1/2018 250/483.1 |

(Continued)

FOREIGN PATENT DOCUMENTS

WO   02054955 A2   7/2002

OTHER PUBLICATIONS

Ng et al., Flexible sensor array with bulk heterojunction organic photodiode, May 2008, Applied Physics Letters, vol. 92, Iss. 21, pp. 213303-1 to 213303-3.*

(Continued)

*Primary Examiner* — David Porta
*Assistant Examiner* — Jeremy S Valentiner

(57) ABSTRACT

An X-ray detector panel includes a plurality of photodetector wafers are arranged in a photodetector array. Each photodetector wafer comprises a sensing surface, a contact surface disposed opposite the sensing surface, and an electrical contact coupled to the contact surface. A substrate is coupled to the photodetector array such that the photodetector array is substantially surrounded by the substrate and a face surface of the substrate is substantially coplanar with the sensing surface. A scintillator is coupled to the face surface of the substrate and substantially covers the sensing surfaces of the photodetector array. A scintillator cover is substantially sealingly coupled to the face surface.

18 Claims, 4 Drawing Sheets

(56) References Cited

U.S. PATENT DOCUMENTS

| | | | | |
|---|---|---|---|---|
| 2011/0114839 A1* | 5/2011 | Stecker | ................ | B22F 3/1055 |
| | | | | 250/307 |
| 2012/0097857 A1* | 4/2012 | Hayatsu | ................ | G01T 1/2018 |
| | | | | 250/366 |
| 2014/0321616 A1* | 10/2014 | Gibson | .................... | G01T 1/20 |
| | | | | 378/62 |

OTHER PUBLICATIONS

International Search Report and Written Opinion for PCT/US2015/023902 mail date Jun. 23, 2015, 11 pages.

* cited by examiner

X-RAY DETECTOR PANEL

BACKGROUND

The invention generally relates to digital X-ray detector panels.

The use of digital radiological imaging continues to be invaluable with respect to a variety of technical applications. Digital radiological imaging is a mainstay in the medical field allowing health care professionals to quickly discern and diagnose internal abnormalities of their patients. Additionally, its use has become increasingly important in industrial fields for visualizing internal contents of parts, baggage, parcels, and other objects, and for visualizing the structural integrity of objects and other purposes. Indeed, the evolution of digital X-ray detectors has enhanced both workflow and image quality in the field of radiological imaging.

Generally, radiological imaging involves the generation of X-rays that are directed toward an object of interest. The X-rays pass through and around the object and then impact an X-ray film, X-ray cassette, or digital X-ray detector. In the context of the digital X-ray detector, these X-ray photons traverse a scintillator that converts the X-ray photons to visible light, or optical photons. The optical photons then collide with the photodetectors of a digital X-ray receptor and are converted to electrical signals which are then processed as digital images that can be readily viewed, stored, and/or transmitted electronically.

It is a common practice in the X-ray detector industry to tile multiple photodetector panels together into a larger panel because either a single panel is not large enough or is too expensive. In the case of a complementary metal-oxide semiconductor (CMOS) based X-ray detector, for instance, a single 20 centimeter by 20 centimeter squared detector panel would require using a 30 centimeter wafer, which is much more expensive than tiling 20 centimeter wafers due to both the low yield of the larger panel as well as the expensive equipment of the larger wafer. In the existing technology, the X-ray scintillator such as CsI is deposited on a fiber optic plate (FOP) and sealed with a scintillator cover. The obtained scintillator assembly is then attached onto the tiled CMOS panel, which not only degrades the performance of the scintillator but also add significant cost to the product since the FOP is very expensive.

SUMMARY OF THE INVENTION

In one embodiment, the invention provides an X-ray detector panel. A plurality of photodetector wafers are arranged in a photodetector array. Each photodetector wafer comprises a sensing surface, a contact surface disposed opposite the sensing surface, and an electrical contact coupled to the contact surface. A substrate is coupled to the photodetector array such that the photodetector array is substantially surrounded by the substrate and a face surface of the substrate is substantially coplanar with the sensing surface. A scintillator is coupled to the face surface of the substrate and substantially covers the sensing surfaces of the photodetector array. A scintillator cover is substantially sealingly coupled to the face surface.

In another embodiment, the invention provides a method of making an X-ray detector panel. A plurality of photodetector wafers are provided, where each photodetector wafer comprises a sensing surface, a contact surface disposed opposite the sensing surface, and an electrical contact coupled to the contact surface. The plurality of photodetector wafers are arranged upon a substantially flat surface, with the plurality of photodetector wafers defining a photodetector array. A substrate is applied to the photodetector array such that the photodetector array is substantially surrounded by the substrate and a face surface of the substrate is substantially coplanar with the sensing surface. A scintillator is coupled to the face surface of the substrate such that the scintillator substantially encloses the sensing surfaces of the photodetector array. A scintillator cover is substantially sealed to the face surface.

DETAILED DESCRIPTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

Figure 1:
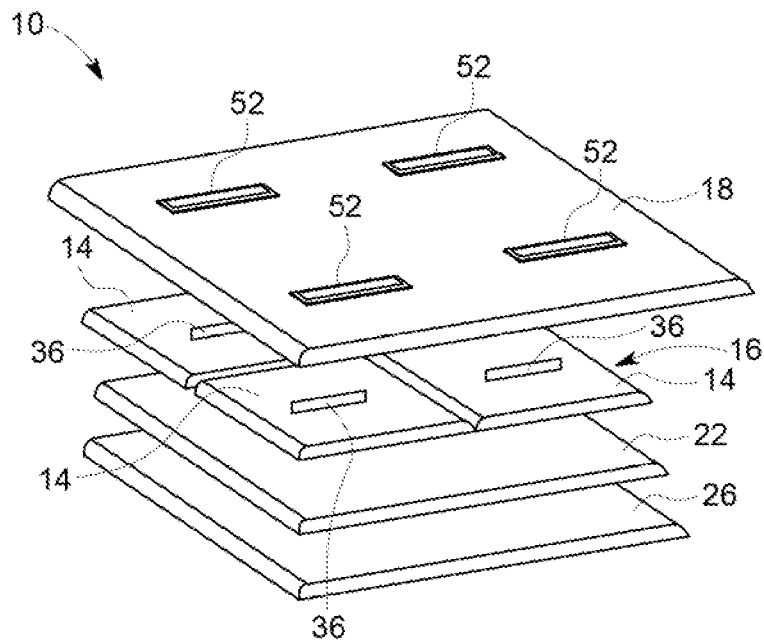
FIG. 1 is an exploded view of an X-ray detector panel according to the present invention.

Referring to FIG. 1, an X-ray detector panel assembly 10 includes a plurality of tiled photodetector wafers 14 arranged in a photodetector array 16. The photodetector array 16 is disposed between a substrate 18 and a scintillator 22. A scintillator cover 26 is coupled to the scintillator 22 opposite the tiled wafers 14.

The scintillator cover 26 is formed of a material that is substantially transparent to radiation in a desired energy range. For example, in the present example, the scintillator cover 26 is substantially transparent to X-rays, and may be formed, for example, of a metal such as aluminum, stainless steel, copper, nickel, or alloys thereof. In another example, the scintillator cover may be made of glass, graphite, or a high temperature polymer such as a polyetherimide and the like. In yet another embodiment, the scintillator cover may be made of a sheet of a composite material, such as, a carbon-fiber composite sheet, laminated on both sides with aluminum foil. These examples are merely illustrative and the scintillator cover may be made of any other suitable materials.

X-ray photons that are not absorbed by the target (e.g. the body of a patient), pass through the scintillator cover 26 and strike the scintillator 22. The scintillator 22 converts the unabsorbed X-ray photons into visible light photons. In one embodiment, the scintillator 22 comprises ionic materials such as cesium iodide (CsI), although any other suitable ionic materials, for example, cesium iodide crystals doped with thallium (CsI:Tl), thallium doped sodium iodide (NaI:Tl), cesium iodide crystals doped with sodium (CsI:Na), lanthanum bromide (LaBR3), cerium iodide (CeI) and gadolinium oxysulfide, may be used in the scintillator 22.

Figure 2:
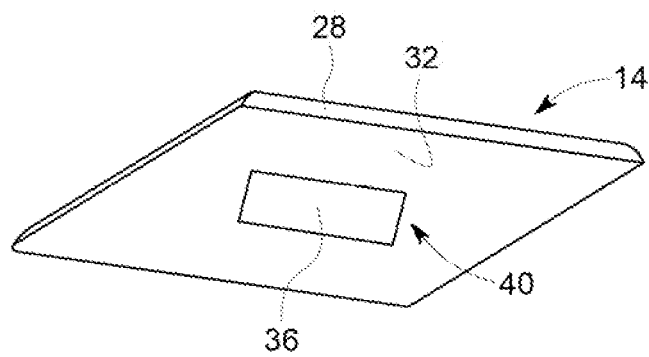
FIG. 2 is a perspective view of a photodetector wafer of the X-ray detector of FIG. 1.

Referring to FIG. 2, each of the photodetector wafers 14 of the photodetector array 16 has a sensing surface 28 and a contact surface 32. Referring to FIG. 1, the sensing surface 28 faces the scintillator 22, while the contact surface 32 faces the substrate 18.

Each photodetector wafer 14 may be a CMOS-type detector comprising a plurality of photodiodes which absorb visible light photons from the scintillator 22 (FIG. 1) and convert the visible light into corresponding electrical signals. Any technique known in the art may be used to generate the X-ray image from the electrical signals. In other implementations, any other types of transducers may be used for converting the incident visible light into appropriate electrical output signals. The electrical signals may be used to generate an X-ray image.

The electrical signals are relayed to contacts 36 positioned on the contact surface 32 of the photodetector wafer 14. Referring to FIG. 2, in the illustrated embodiment, the contacts 36 are substantially centered in a middle portion 40 of the contact surface 32 of the photodetector wafer 14. Centering the contacts 36 on the contact surface 32, as opposed to positioning the contact on an edge surface of the photodetector wafer, provides for improved sealing between the tiled photodetectors 14 of the photodetector array 16. In a complete imaging system, the contacts 36 are in electric communication with signal conditioning and imaging processing sub-systems configured for generating useful radiological images.

Figure 3:
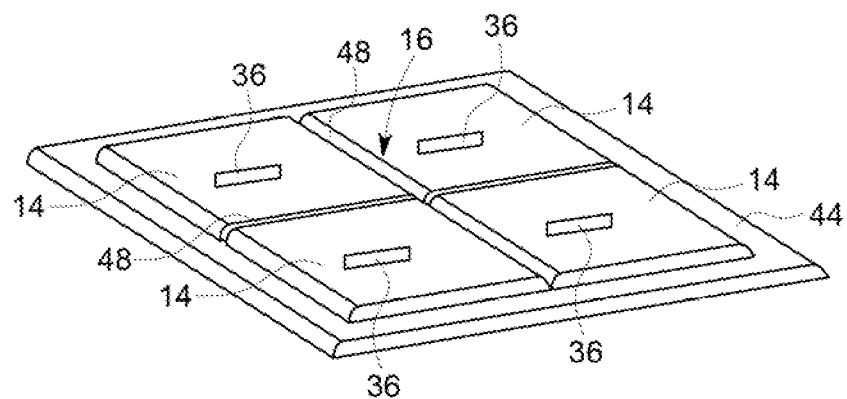
FIG. 3 is a perspective view of photodetector wafers tiled upon a flat plate to define a photodetector array.

The X-ray detector panel assembly may be manufactured according to the following method. Referring to FIG. 3, the photodetector wafers 14 are arranged in the photodetector array 16 on a substantially flat plate 44 or other flat surface, with the sensing surface facing down onto the flat plate 44. The wafers 14 may be temporarily coupled to the plate 44 either by applying a vacuum between the wafers and the plate with vacuum holes on the plate 44, or by removably gluing the wafers onto the plate 44. Gaps 48 are defined between adjacent wafers 14 of the photodetector array 16.

Figure 4:
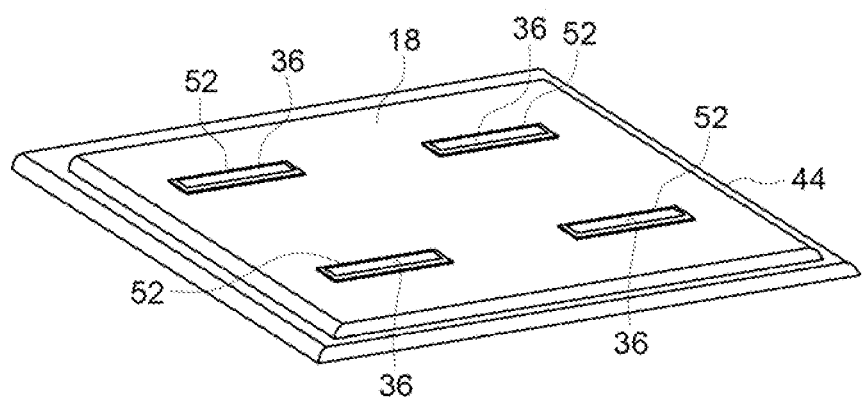
FIG. 4 is a perspective view of a 3D printed substrate applied to the photodetector array of FIG. 3.

Once the photodetector wafers 14 are positioned and temporarily coupled to the plate 44, 3D surface data is gathered, such as with a laser scanner. With the 3D surface data gathered, and referring to FIG. 4, the substrate 18 is printed onto and around the photodetector array 16, as a backing layer, with a 3D metallic and polymer printer or other additive manufacturing technique.

In particular, the substrate 18 substantially surrounds the photodetector array 16, filling in the gaps 48 (FIG. 3) between adjacent photodetector wafers 14, and substantially covering the contact surfaces of the respective photodetector wafers 14. Based on the 3D surface data, and referring to FIG. 4, contact trace areas 52 corresponding to the position(s) of the contacts 36 remain uncovered by the substrate 18, such that the contacts 36 of the wafers 14 remain accessible for interconnection with the above-described signal conditioning and image processing components (not shown). In one embodiment, the substrate may be composed of a layer of metal, such as aluminum. In other embodiments, the substrate backing layer may be composed of a metal oxide ceramic such as $Al_2O_3$.

Figure 5:
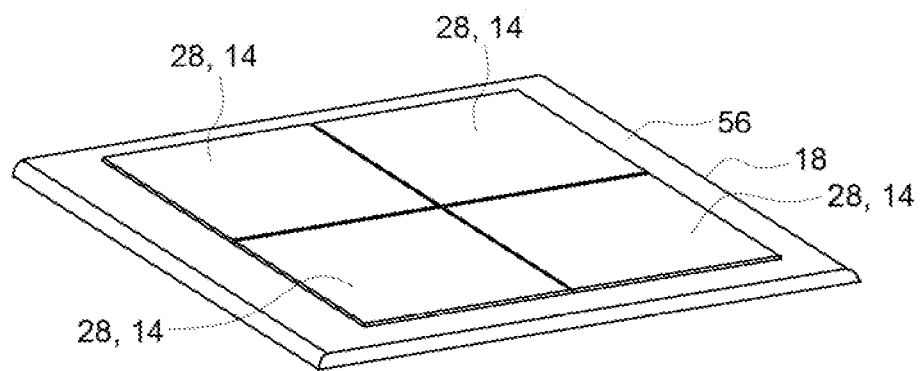
FIG. 5 is a perspective view of the photodetector array together with the 3D printed substrate, after removal of the flat plate.

After printing or otherwise applying the substrate 18 to the photodetector array 16, the flat plate 44 is removed. Referring to FIG. 5, with the flat plate removed, the sensing surfaces 28 of the photodetector wafers 14 and a face surface 56 of the substrate 18 are substantially coplanar.

Figure 6:
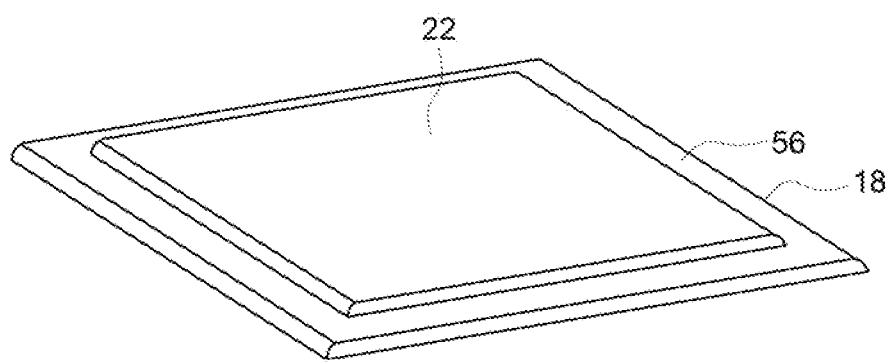
FIG. 6 is a perspective view of a scintillator applied to the assembly of FIG. 5

Referring to FIG. 6, the next step is to deposit the scintillator 22 onto the sensing surfaces of the photodetector array and portions of the face surface 56 of the substrate 18, thereby enclosing the sensing surfaces of the photodetector array. The scintillator 22 may be deposited with a CsI furnace, such that the CsI has a needle structure that substantially prevents light photons from spreading. Alternatively, the scintillator may be applied by an additive manufacturing technique such as 3D printing.

Figure 7:
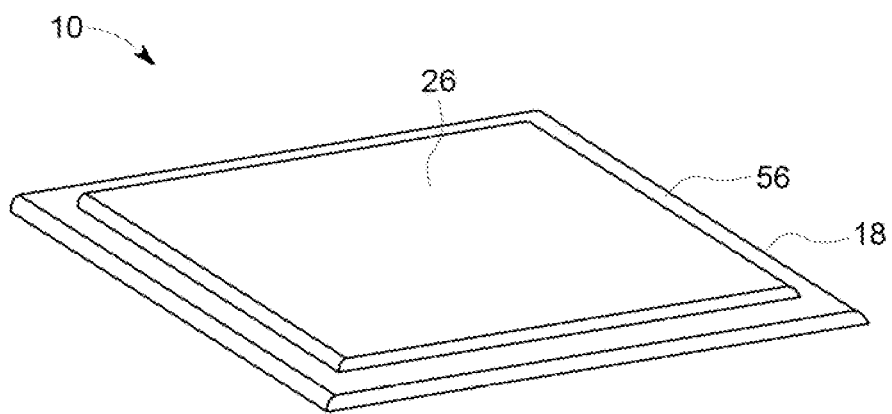
FIG. 7 is a perspective view of a scintillator cover applied to the assembly of FIG. 6.

Finally, and referring to FIG. 7, the scintillator cover 26 is sealingly coupled to the face surface 56 of the substrate 18, thereby surrounding the scintillator 22. The scintillator cover may be coupled and sealed by the application of an appropriate adhesive (e.g., an epoxy adhesive) at the interface between the scintillator cover 26 and the face surface 56. In the illustrated embodiment, the scintillator cover 26 does not touch the scintillator 22. The scintillator cover 26 is slightly larger than the area of the scintillator 22 and is sealed to the face surface 56 of the substrate 18 using a bead of the epoxy adhesive. The height of the epoxy bead is such that the scintillator cover 26 sits just slightly above the top of face surface 56 of the substrate 18.

Thus the invention provides an X-ray detector panel and a method of manufacturing an X-ray detector panel. Various features of the invention are set forth in the following claims.

We claim:

1. An X-ray detector assembly, comprising:
   a plurality of photodetector wafers arranged in a photodetector array, each photodetector wafer comprising a sensing surface, a contact surface opposite the sensing surface, and an electrical contact coupled to the contact surface, wherein the sensing surfaces collectively form a sensing surface side of the photodetector array and the contact surfaces collectively form a contact surface side of the photodetector array;
   a substrate deposited over the contact surface side of the photodetector array such that the photodetector array is substantially embedded into the substrate and a face surface of the substrate is substantially coplanar with the sensing surface, the substrate further defining contact windows aligned with the electrical contacts to provide access to the contacts;
   a scintillator layer deposited onto the sensing surface of the photodetector array and onto the face surface of the substrate along the perimeter of the array such that the scintillator layer encloses the sensing surface side of the photodetector array and any other portions of the array exposed relative to the face surface of the substrate; and
   a scintillator cover sealed to the face surface of the substrate, the scintillator cover completely covering and enclosing the scintillator layer including all exposed surfaces of the scintillator layer relative to the face surface of the substrate.

2. The X-ray detector assembly of claim 1, wherein the photodetector wafers comprise a complementary metal-oxide semiconductor (CMOS) detector.

3. The X-ray detector of claim 1, wherein the substrate is applied to the photodetector array by additive manufacturing.

4. The X-ray detector of claim 3, wherein the substrate is printed onto and around the photodetector array by 3D printing.

5. The X-ray detector of claim 1, wherein substrate comprises a metal.

6. The X-ray detector of claim 1, wherein the substrate comprises a ceramic.

7. The X-ray detector of claim 1, wherein the photodetector array defines gaps between adjacent photodetector wafers, and the substrate fills the gaps.

8. The X-ray detector of claim 1, wherein the contact of at least one photodetector wafer is coupled to a middle portion of the respective contact surface electrical contact.

9. A method of manufacturing an X-ray detector, comprising:
   providing a plurality of photodetector wafers, each photodetector wafer comprising a sensing surface, a contact surface opposite the sensing surface, and an electrical contact coupled to the contact surface, wherein the sensing surfaces collectively form a sensing surface side of the photodetector array and the contact surfaces collectively form a contact surface side of the photodetector array;
   arranging the plurality of photodetector wafers upon a substantially flat surface, the plurality of photodetector wafers defining a photodetector array;
   applying a substrate material to the contact surface side of the photodetector array such that the photodetector array is substantially embedded into the substrate and a face surface of the substrate is substantially coplanar with the sensing surface, the substrate further defining contact windows aligned with the electrical contacts to provide access to the contacts;
   depositing a scintillator material onto the sensing surface of the photodetector array and onto the face surface of the substrate along the perimeter of the array and forming a scintillator layer that encloses the sensing surface side of the photodetector array and any other portions of the array exposed relative to the face surface of the substrate; and
   sealing a scintillator cover to the face surface of the substrate, the scintillator cover completely covering and enclosing the scintillator layer including all exposed surfaces of the scintillator layer relative to the face surface of the substrate.

10. The method of claim 9, wherein the act of providing a plurality of photodetector wafers further comprises providing a complementary metal-oxide semiconductor (CMOS) detector.

11. The method of claim 9, wherein the act of applying the substrate to the photodetector array comprises additive manufacturing.

12. The method of claim 11, wherein the act of applying the substrate to the photodetector array comprises 3D printing, wherein the substrate is printed onto and around the photodetector array.

13. The method of claim 9, wherein the act of applying the substrate comprises applying a metal.

14. The method of claim 9, wherein the act of applying the substrate comprises applying a ceramic.

15. The method of claim 9, wherein the act of applying the substrate comprises filling gaps defined between adjacent photodetector wafers.

16. The method of claim 9, wherein the act of providing a plurality of photodetector wafers includes positioning at least one contact in a middle portion of the respective contact surface.

17. The X-ray detector of claim 1, wherein the photodetector array defines side surfaces between the sensing surface side and the contact surfaces side, said side surfaces completely covered by the combination of the substrate and the scintillator layer.

18. The method of claim 9, wherein the photodetector array defines side surfaces between the sensing surface side and the contact surfaces side, the combination of the substrate and the scintillator layer completely covering said side surfaces.

* * * * *